(12) United States Patent
Chang

(10) Patent No.: US 7,992,288 B2
(45) Date of Patent: Aug. 9, 2011

(54) APPARATUS FOR FIXING FLEXIBLE PRINTED CIRCUIT MODULE TO SLIDING MECHANISM OF PORTABLE ELECTRONIC DEVICE

(75) Inventor: Cheng-Lung Chang, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 546 days.

(21) Appl. No.: 12/174,708

(22) Filed: Jul. 17, 2008

(65) Prior Publication Data
US 2009/0025214 A1 Jan. 29, 2009

(30) Foreign Application Priority Data
Jul. 25, 2007 (CN) .......................... 2007 1 0075296

(51) Int. Cl.
*B23P 19/00* (2006.01)
*H01R 43/00* (2006.01)
(52) U.S. Cl. .............. 29/748; 29/757; 29/758; 361/827; 455/575.4
(58) Field of Classification Search .................. 29/735, 29/757, 758, 750, 832, 830; 455/575.4; 361/827
See application file for complete search history.

(56) References Cited

U.S. PATENT DOCUMENTS

| | | | | |
|---|---|---|---|---|
| 4,193,187 A | * | 3/1980 | Haller et al. | 29/749 |
| 4,393,580 A | * | 7/1983 | Hall, Jr. | 29/749 |
| 5,339,221 A | * | 8/1994 | Conroy-Wass et al. | 361/796 |
| 5,475,916 A | * | 12/1995 | Schollenberger | 29/747 |
| 5,980,322 A | * | 11/1999 | Madsen et al. | 439/620.26 |
| 6,711,921 B1 | * | 3/2004 | Yang | 70/58 |
| 2004/0226168 A1 | * | 11/2004 | Tien | 29/748 |
| 2005/0221873 A1 | * | 10/2005 | Kameyama et al. | 455/575.4 |
| 2007/0105606 A1 | * | 5/2007 | Yoon et al. | 455/575.4 |
| 2007/0205751 A1 | * | 9/2007 | Suzuki et al. | 324/158.1 |

* cited by examiner

*Primary Examiner* — A. Dexter Tugbang
*Assistant Examiner* — Jeffrey T Carley
(74) *Attorney, Agent, or Firm* — Steven M. Reiss

(57) ABSTRACT

An apparatus (40) for fixing a flexible printed circuit board module (20) to a sliding mechanism (10) of a portable electronic device is provided. The apparatus includes a base (41) and a pressing device (43). The base includes an assembling stage (414) and defines a mounting space (419) therein. The assembling stage is configured for positioning the sliding mechanism and the flexible printed circuit board module thereto. The pressing device is mounted in the mounting space and configured for sliding within the mounting space and pressing the flexible printed circuit board module toward the sliding mechanism.

14 Claims, 15 Drawing Sheets

US 7,992,288 B2

APPARATUS FOR FIXING FLEXIBLE PRINTED CIRCUIT MODULE TO SLIDING MECHANISM OF PORTABLE ELECTRONIC DEVICE

BACKGROUND

1. Field of the Invention

The present invention relates to apparatuses each for fixing two workpieces together, and particularly to an apparatus for fixing a flexible printed circuit module to a sliding mechanism of a portable electronic device.

2. Description of Related Art

Portable electronic devices, such as mobile phones or personal digital handsets, often have a sliding mechanism equipped with a base body and a cover body. Thus, the sliding mechanism enables the base body and the cover body to slide with respect to each other. To achieve an electrical connection between the base body and cover body, a flexible printed circuit module is typically fixed to the sliding mechanism.

The fixing of the flexible printed circuit module to the sliding mechanism is typically done manually, which is time-consuming and subject to human error.

Therefore, a heretofore-unaddressed need exists in the art to address the aforementioned deficiencies and inadequacies.

BRIEF DESCRIPTION OF THE DRAWINGS

Many aspects of the present apparatus for fixing a flexible printed circuit module to a sliding mechanism of a portable electronic device can be better understood with reference to the following drawings. These drawings are not necessarily drawn to scale, the emphasis instead being placed upon clearly illustrating the principles of the apparatus for fixing a flexible printed circuit module with a sliding mechanism of a portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Figure 1:
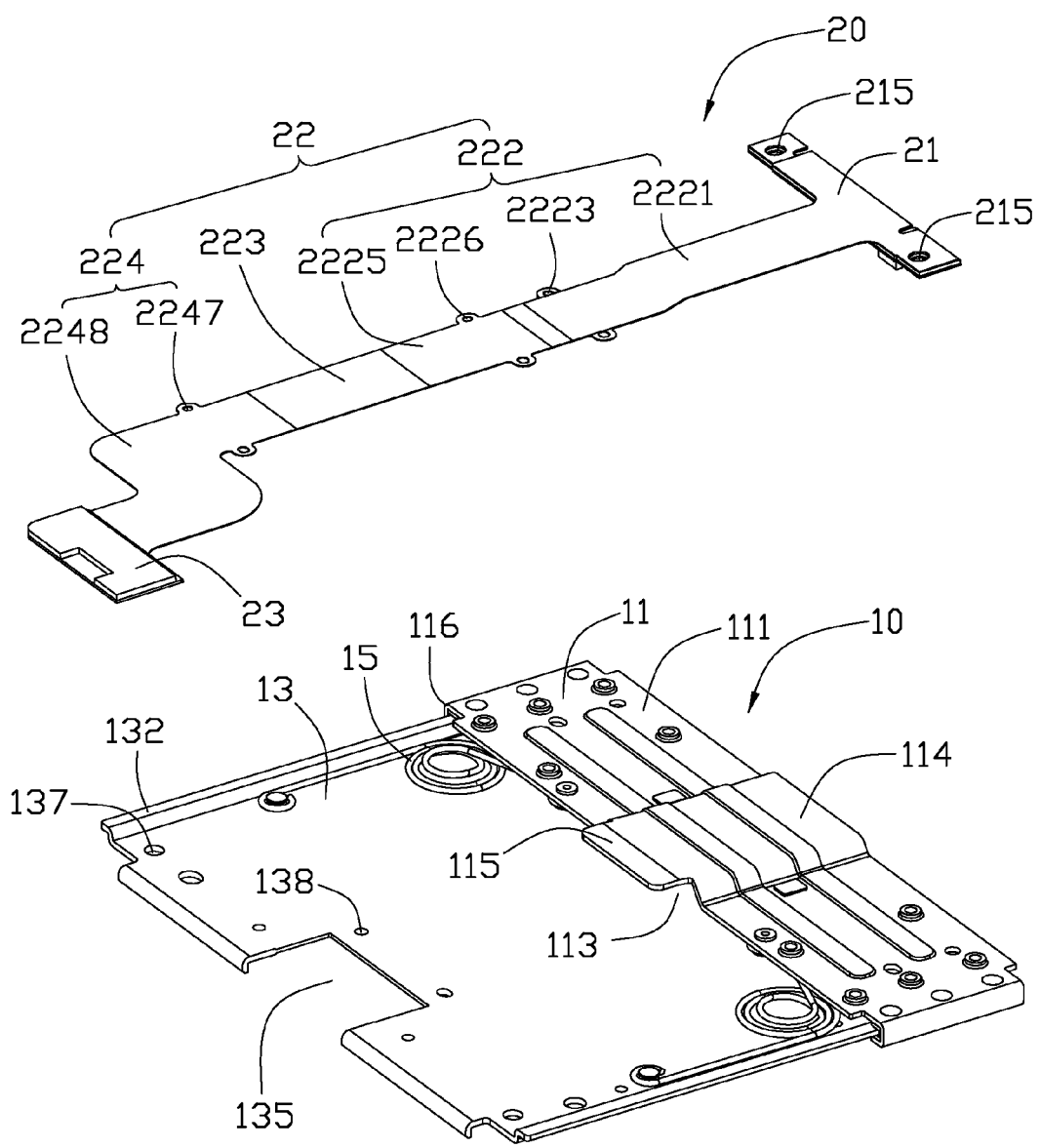
FIG. 1 is an isometric view of a combination of a flexible printed circuit module and a sliding mechanism in a preassembled state in accordance with a present embodiment.

Referring to FIG. 1, the sliding mechanism 10 includes a fixable member 11, a slidable member 13, and two restoring mechanisms 15. The slidable member 13 is assembled with the fixable member 11 in such a manner that the slidable member 13 can slide with respect to the fixable member 11 by urging the two restoring mechanisms 15.

The fixable member 11 is generally a rectangular board and includes a first surface 111 and an opposite second surface (not labeled). The first surface 111 and the second surface are respectively recessed and protruded, and thus, not only define an accommodating space 113 exposed to the slidable member 13, but also form a protruding stage 114 of the fixable member 11 corresponding to the accommodating space 113. The protruding stage 114 has a resisting flange 115 extending therefrom along the slidable member 13. Each side of the fixable member 11 defines a sliding groove 116. The two sliding grooves 116 facilitate the sliding of slidable member 13 relative to the fixable member 11.

The slidable member 13 is generally a rectangular board and configured (i.e., structured/arranged) to have two sliding rails 132 for corresponding to the two sliding grooves 116. Thus, engagement of the sliding rails 132 in the sliding grooves 116 enables the slidable member 13 to slide relative to the fixable member 11. The slidable member 13 further has a cutout 135, four positioning holes 137, and two aligning holes 138 defined therethrough. The cutout 135 is generally rectangular and located at the approximate middle edge portion of the slidable member 13. The four positioning holes 137 are respectively disposed at four corners of the slidable member 13 and adjacent to the two sliding rails 132. The two aligning holes 138 are respectively defined in proximity to the interior side of the cutout 135.

Figure 2:
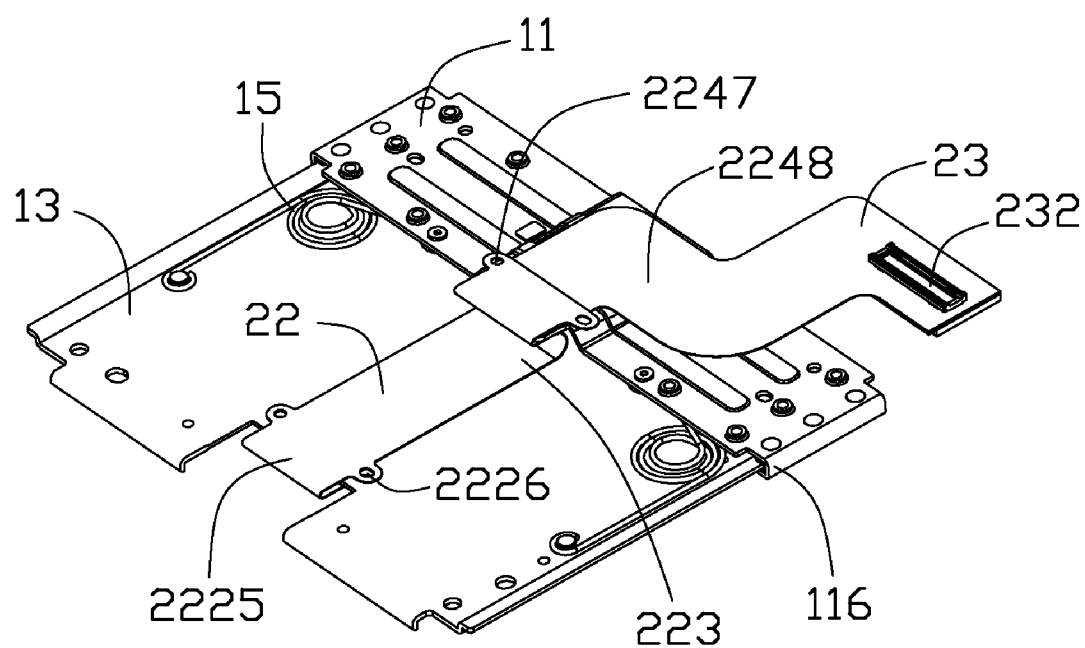
FIG. 2 is an assembled view of the preassembled combination shown in FIG. 1.
Figure 3:
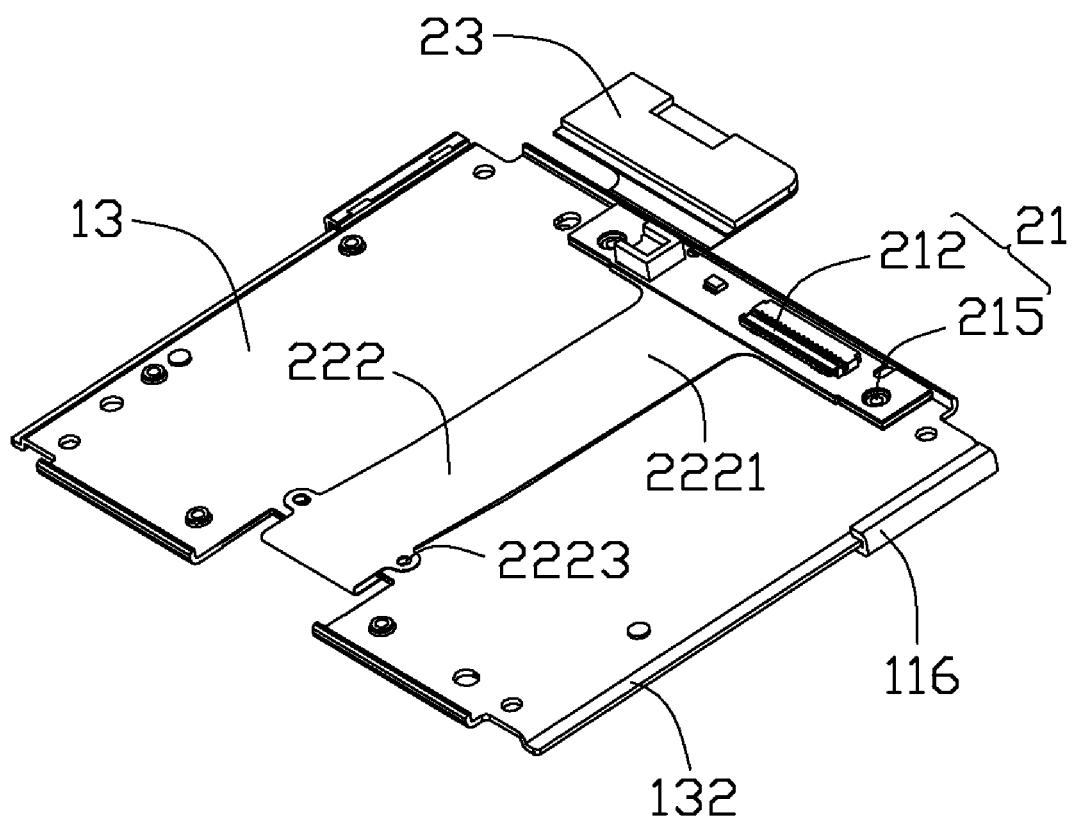
FIG. 3 is similar to FIG. 2, but viewed from another angle.

Referring further to FIGS. 2 and 3, a flexible printed circuit module (FPC) 20, is provided to assemble with the sliding mechanism 10. The FPC module 20 is strap-shaped and includes a first connecting portion 21, an FPC body 22, and a second connecting portion 23. The two opposite ends of FPC body 22 connect to the first and second connecting portions 21 and 23, respectively. The first and second connecting portions 21 and 23 have a first connector 212 and a second connector 232 attached respectively thereto. The first connecting portion 21 further defines two through holes 215. The two through holes 215 are respectively located at two sides of the first connector 212. The two through holes 215 are configured for fixing the FPC module 20 to the sliding mechanism 10 by a variety of fixing means such as bolting, melting, or the like.

The FPC body 22, referring back to FIG. 1, includes an attaching body 222, a detaching body 223, and an adhering body 224. The opposite ends of the detaching body 223 are connected to the attaching body 222 and the adhering body 224, respectively. The attaching body 222 includes an attaching portion 2221 and a positioning portion 2225. The attaching portion 2221 connects to the first connecting portion 21. The positioning portion 2225 extends from the detaching body 223. The positioning portion 2225 defines two first positioning holes 2223 and two second positioning holes and 2226. The first and second positioning holes 2223 and 2226 facilitate the positioning portion 2225 being securely positioned to the slidable member 13.

The adhering body 224 further connects to the second connecting portions 23 and defines two third positioning holes 2247 and an adhering end portion 2248. The two third positioning holes 2247 allow the adhering body 224 to be securely positioned to the protruding stage 114 of the fixable member 11. The attaching portion 2221, the positioning portion 2225, and the adhering end portion 2248 respectively have one adhering layer (not shown) formed thereon. The adhering layer can be one of a glue layer, an adhesive coating, and so on.

Figure 4:
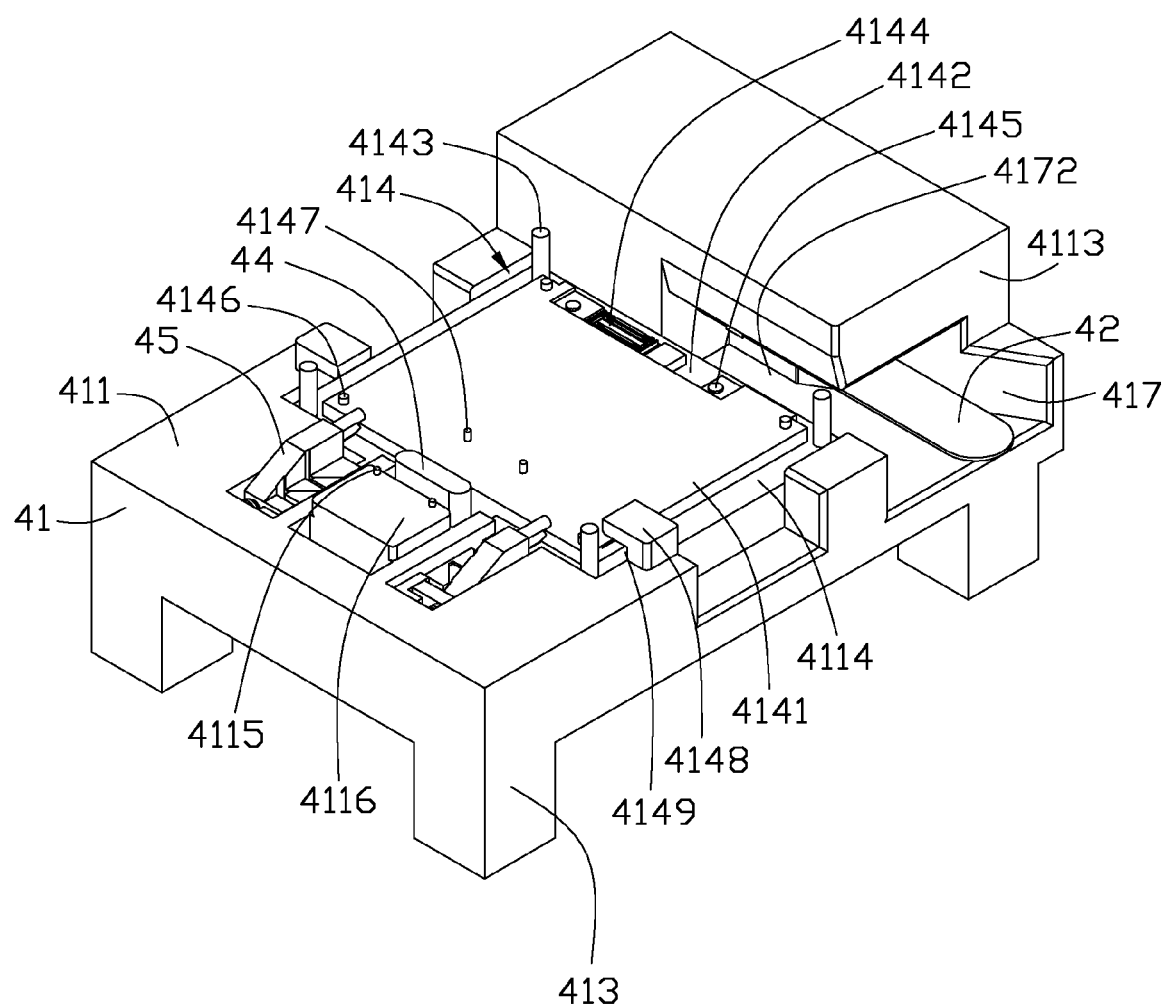
FIG. 4 is an isometric view of an apparatus for transforming the preassembled combination shown in FIG. 1 into the assembled combination shown in FIGS. 2 and 3.
Figure 5:
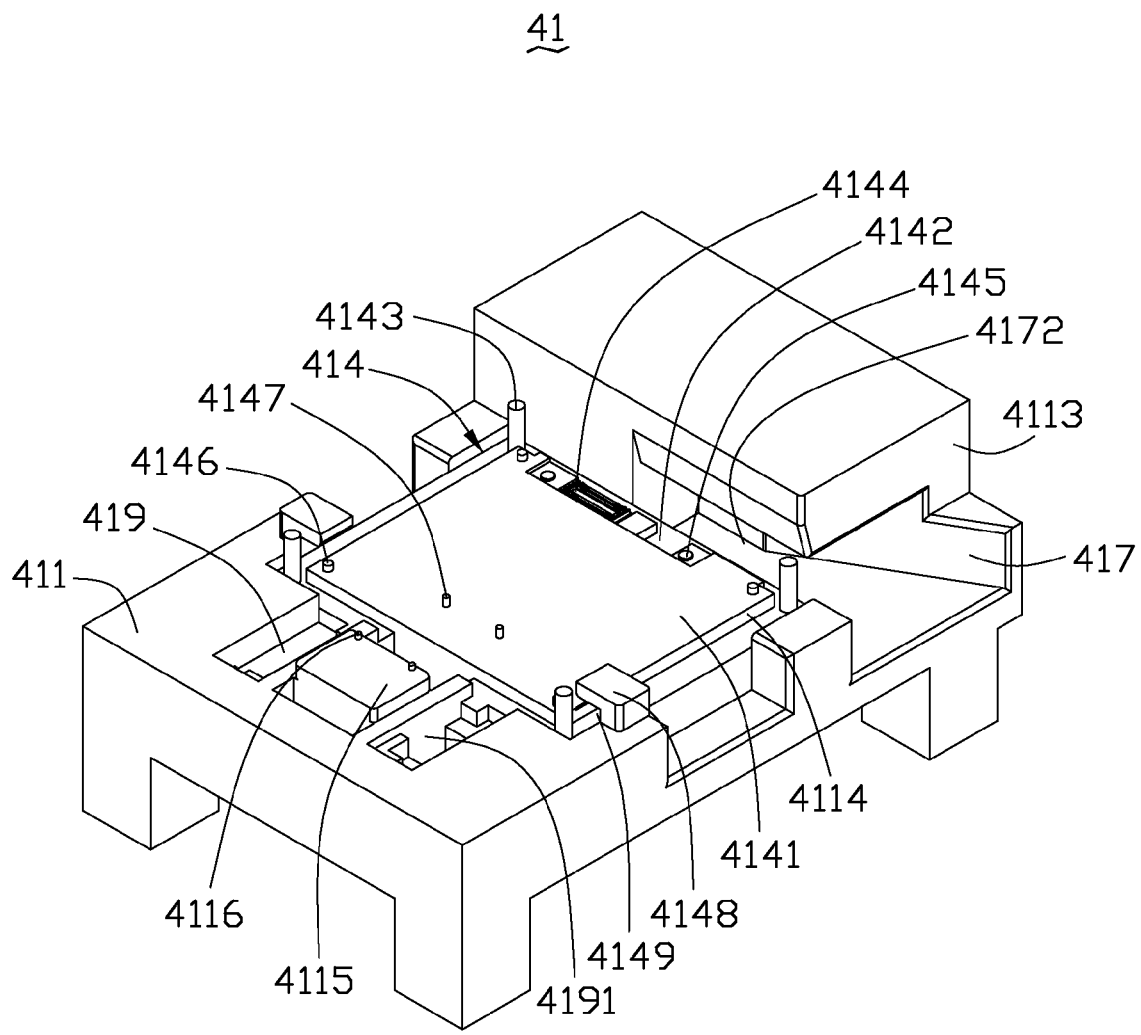
FIG. 5 is an isometric view of a base of the apparatus shown in FIG. 4.
Figure 6:
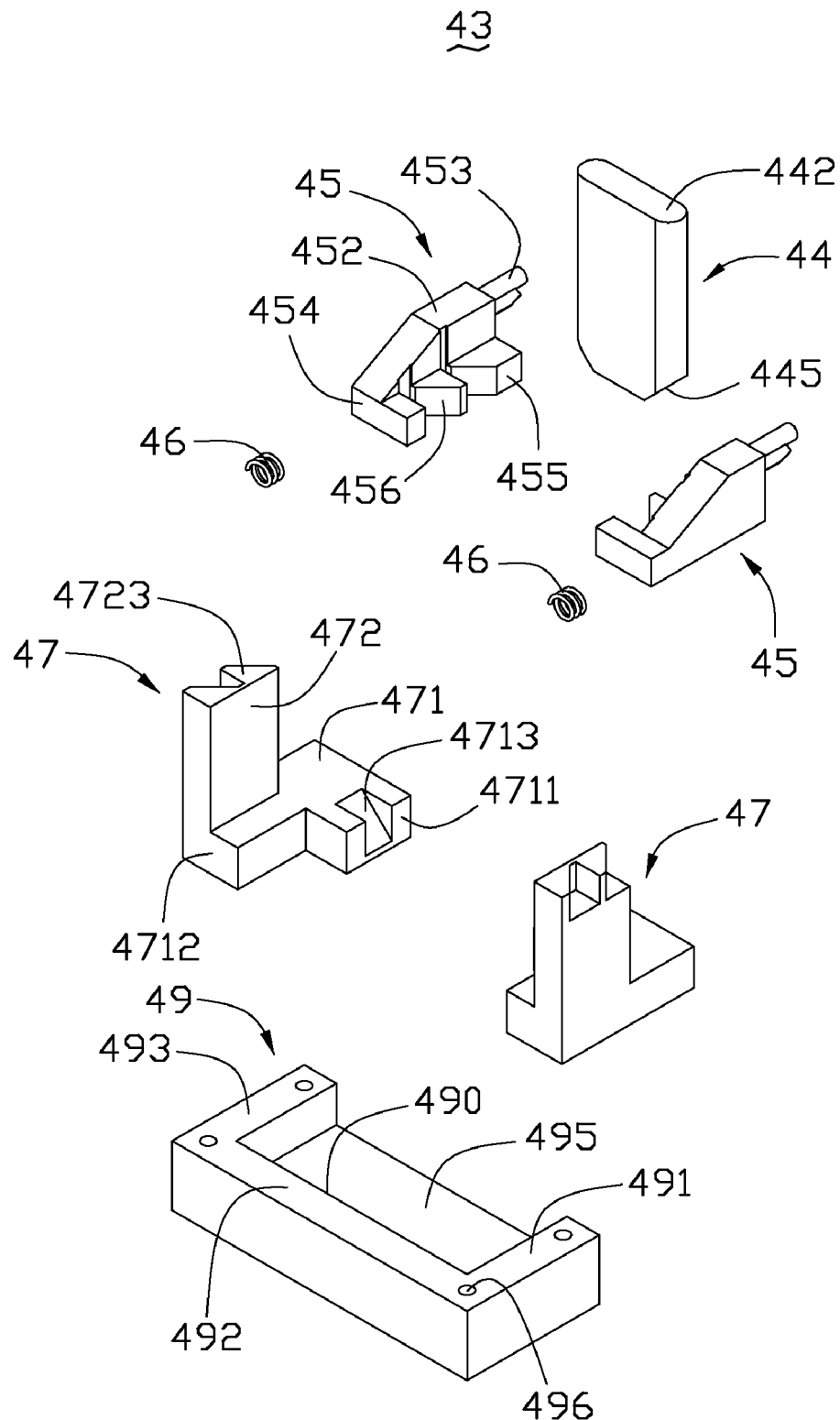
FIG. 6 is an exploded view of a pressing device of the apparatus shown in FIG. 4.

Referring to FIGS. 4-6, an apparatus 40 for fixing the FPC module 20 to the sliding mechanism 10 includes a base 41, a detaching board 42, and a pressing device 43. The detaching board 42 and the pressing device 43 are assembled to the base 41.

The base 41 includes a working platform 411, a bottom wall 412 located in parallel to the platform 411, four supporting columns 413, an assembling stage 414, an accommodating chamber 417 for accommodating the detaching board 42 therein, and a mounting space 419 for mounting the pressing device 43 therein. The working platform 411 has a protruding block 4113 protruded therefrom, a generally rectangular accommodating cavity 4114 defined therein, and a positioning block 4115 formed thereon. The accommodating cavity 4114 is disposed between the protruding block 4113 and the positioning block 4115. By measuring from the upper surface of the working platform 411, the positioning block 4115 is relatively lower than the protruding block 4113. The positioning block 4115 has two positioning posts 4116 formed on the upper surface thereof.

The four supporting columns 413 are formed on four corners of the working platform 411. The assembling stage 414 is accommodated in the accommodating cavity 4114. The assembling stage 414 functions to assemble the sliding mechanism 10 with the FPC module 20. The assembling stage 414 includes a base stage 4141, four first positioning columns 4143, a first mother connector 4144, two second positioning columns 4145, four third positioning columns 4146, two fourth positioning columns 4147, and two resisting blocks 4148.

Referring further to FIG. 5, the base stage 4141 is a generally rectangular-shaped board and disposed within the accommodating cavity 4114. By measuring from the lower surface of the accommodating cavity 4114, the base stage 4141 is lower than the working platform 411. The base stage 4141 has a slot 4142 defined therein. The slot 4142 is located near the protruding block 4113 and configured for accommodating and mounting the first connector 212 of the FPC module 20 therein. The four first positioning columns 4143 respectively protrude from the lower surface of the accommodating cavity 4114 and are distributed at four corners of the lower surface and around the base stage 4141. The first mother connector 4144 is exposed to the slot 4142 and configured for connecting to the first connector 212. The two second positioning columns 4145 are formed within the slot 4142. The first mother connector 4144 is thus located between the two second positioning columns 4145. The two second positioning columns 4145 respectively correspond to the two through holes 215 of the FPC module 20 and each configured for engaging through the respective through holes 215 so as to secure the first connecting portion 21 within the slot 4142.

Each of the four third positioning columns 4146 correspond to one respective positioning hole 137 of the slidable member 13 and configured for positioning the slidable member 13 thereto. The four third positioning columns 4146 are formed at four corners of the base stage 4141. The two fourth positioning columns 4147 are formed on base stage 4141, both of which correspond to the two aligning holes 138 of the slidable member 13 and configured for aligning then holding the slidable member 13 and the FPC body 22 of the FPC module 20 thereto.

The two resisting blocks 4148 each is generally L-shaped and formed on the working platform 411. The two resisting blocks 4148 are located opposite to each other and respectively extend from the upper surface of the working platform 411, where two resisting slots 4149 are enclosed by the two resisting blocks 4148 and the lower surface of the accommodating cavity 4114. The two resisting slots 4149 are configured for accommodating the fixable member 11 of the sliding mechanism 10 therein so that the fixable member 11 can be resisted from offsetting from the accommodating cavity 4114.

Figure 7:
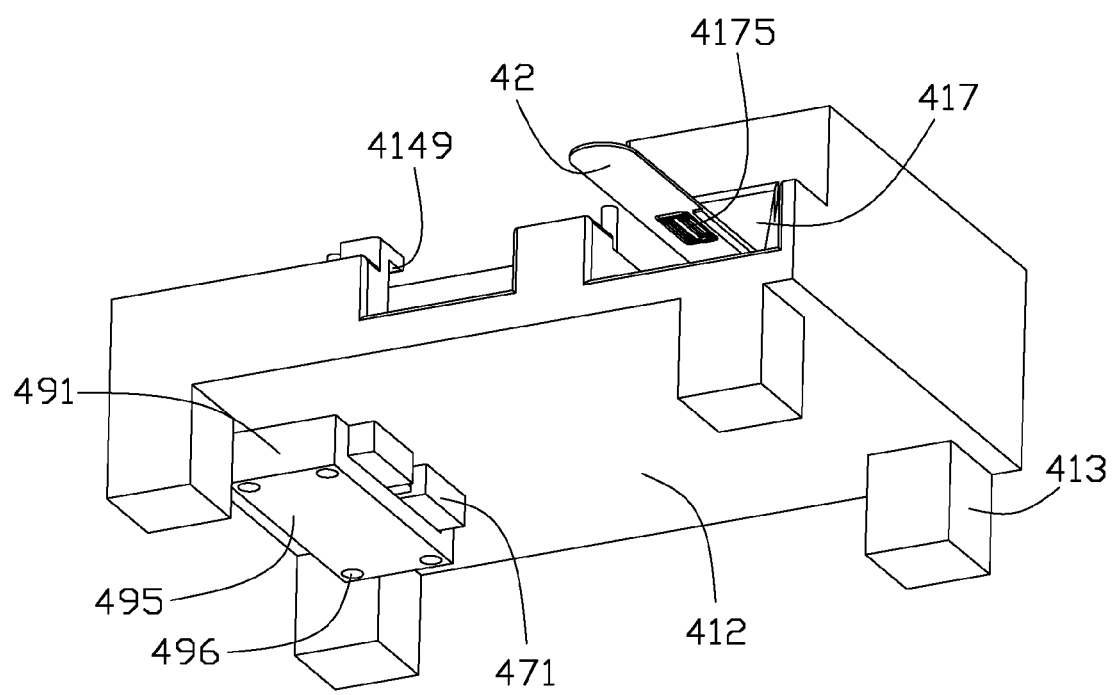
FIG. 7 is another isometric view of the apparatus shown in FIG. 4, showing another aspect thereof.

The accommodating chamber 417, which is configured for accommodating the detaching board 42 therein, is defined in the protruding block 4113 and the working platform 411. The accommodating chamber 417 communicates with the accommodating cavity 4114 via an opening 4172 that is defined in the protruding block 4113. The interior wall of the accommodating chamber 417 has a second mother connector 4175 (as shown in FIG. 7) formed and exposed to the accommodating chamber 417. The second mother connector 4175 is configured for connecting to the second connector 212 of the FPC module 20.

Figure 8:
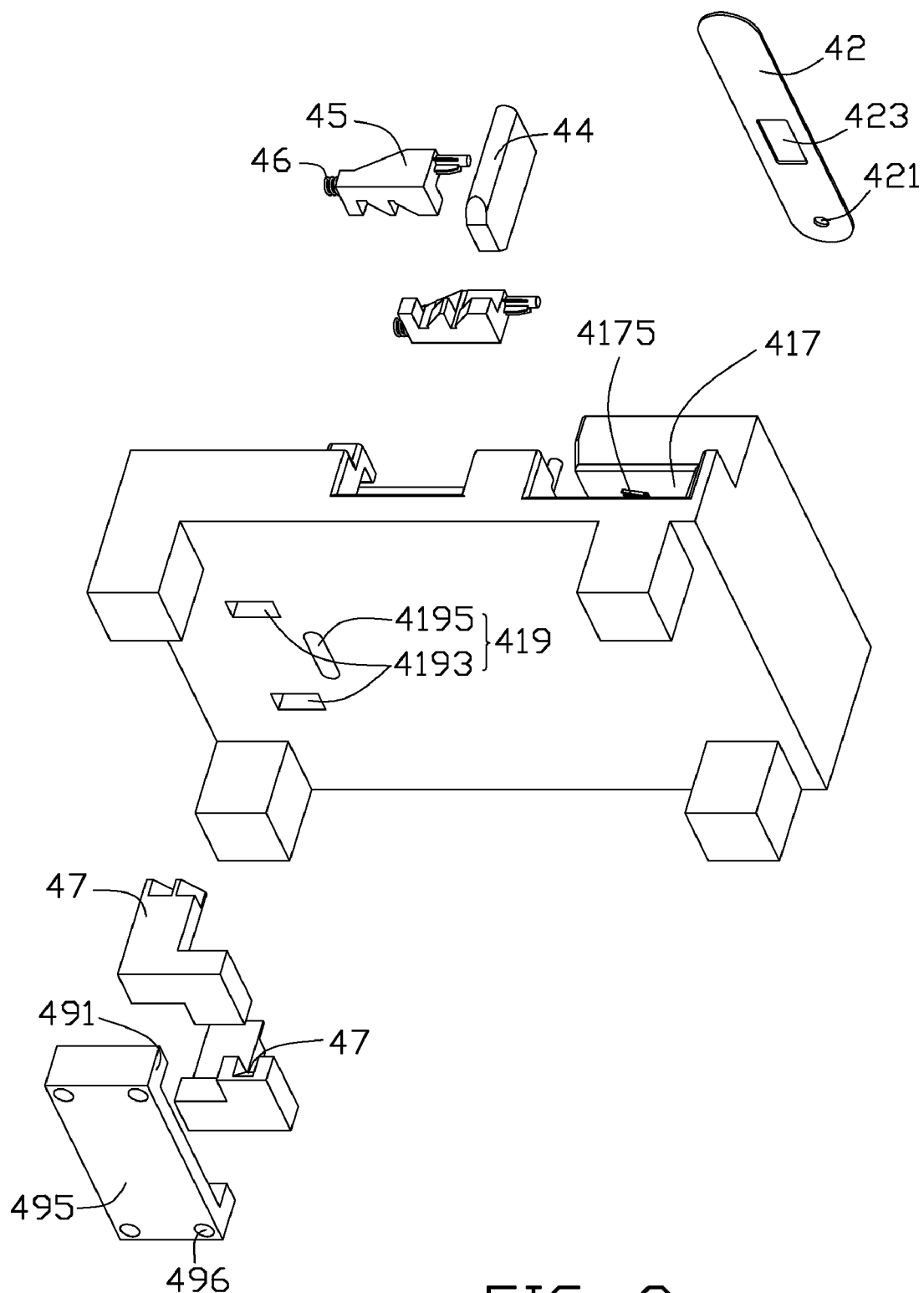
FIG. 8 is an exploded view of the apparatus shown in FIG. 4.

Referring also to FIGS. 5 and 8, the mounting space 419 includes two generally rectangular receiving cavities 4191, two generally rectangular receiving recesses 4193, and a receiving slot 4195. The two receiving cavities 4191 are recessed from the upper surface of the working platform 411 and communicate with the accommodating cavity 4114. The receiving recesses 4193 communicate with the receiving cavities 4191, thus the working platform 411 is defined through by the combination of each receiving recess 4193 and one corresponding receiving cavity 4191. The receiving slot 4195 is defined through the working platform 411 and simultaneously defined by the interior walls of the working platform 411 and the exterior wall of the positioning block 4115.

Referring again to FIGS. 7 and 8, the detaching board 42 is generally a planar board and defines a generally rectangular mounting hole 421 and an accommodating hole 423 defined therethrough. The mounting hole 421 is used to facilitate the detaching board 42 fixably attached within the accommodating chamber 417 by means of screwing. The accommodating hole 423 has a substantially same size and shape as that of the second mother connector 4175. During assembly, the second mother connector 4175 is accommodated in the accommodating hole 423, and the detaching board 42 has an end exposed from the accommodating chamber 417. The end is located opposite to the mounting hole 421.

Referring again to FIGS. 6 and 8, the pressing device 43 can be mounted in the mounting space 419 and includes a pressing stage 44, two resisting members 45, two elastic members 46, two urging blocks 47, and a base block 49.

The pressing stage 44 can be mounted in the receiving slot 4195 of the mounting space 419 and includes a pressing end 442 and an engaging end 445. The engaging end 445 is located opposite to the pressing end 442 and has two inclined walls (not labeled) formed thereof. The two inclined walls are arranged symmetrically with each other. The two elastic members 46 are advantageously coil springs and can be mounted in the mounting space 419.

The two resisting members 45 can be respectively mounted in the receiving cavities 4191 of the mounting space 419 and includes a body portion 452, a limiting portion 453, a resisting portion 454, and an engaging portion 455. The body portion 452 is generally a rectangular block with a cylindrical limiting portion 453 protruding from one end thereof and a ledged resisting portion 454 extended from the other end thereof. The engaging portion 455 is formed on the sidewall of the body portion 452. The engaging portion 455 includes a plurality of ledged walls 456 formed thereto. The plurality of ledged walls 456 are advantageously two ledged walls arranged in parallel to each other.

The two urging blocks 47 each includes a carrying portion 471 and a linking portion 472. The carrying portion 471 is generally L-shaped and includes a first end portion 4711 and a second end portion 4712. The first end portion 4711 and the second end portion 4712 are formed perpendicularly to each other. The first end portion 4711 has an inclined recess 4713 defined in the edge thereof. The inclined recess 4713 is dimensioned in such a manner that the pressing stage 44 can engage in and slide with respect to the inclined recess 4713. The linking portion 472 is perpendicularly disposed on one surface of the second end portion 4712. The linking portion 472 corresponds to the engaging portion 455 and thus has a ledged end 4723 formed therewith for engaging with the plurality of ledged walls 456.

The base block 49 is generally rectangular and defines a generally rectangular mounting recess 490 therein. The mounting recess 490 is enclosed by a first sidewall 491, a second sidewall 492, a third sidewall 493, and a bottom wall 495, and configured for mounting the two urging blocks 47 therein. The first sidewall 491 and the third sidewall 493 respectively have two fixing holes 496 defined therethrough. The fixing holes 496 facilitate the fixing of the base block 49 and the base 41.

During assembly of the apparatus 40, referring back to FIGS. 4 and 8, the detaching board 42 is placed into the accommodating chamber 417 of the base 41 and then screwed within the accommodating chamber 417 by a screw (not shown) engaging in the mounting hole 421. At this stage, the second mother connector 4175 is accommodated in the accommodating hole 423, and the detaching board 42 has an end exposed from the accommodating chamber 417. The end is located opposite to the mounting hole 421.

Next, the pressing device 43 is accommodated in the mounting space 419 of the base 41. In doing that, the linking portion 472 of each urging block 47 is aligned and then inserted into one corresponding receiving recess 4193 of the mounting space 419. The linking portion 472 of each urging block 47 engages through the receiving recess 4193 and the corresponding receiving cavity 4191, and ultimately expose from the receiving cavity 4191. The two urging blocks 47 are assembled with the base 41 with the inclined recesses 4713 thereof facing each other. The carrying portion 471 of each urging block 47 is accommodated and firmly attached within the mounting recess 490 of the base block 49 by screwing the base block 49 to the base 41.

Then, the pressing stage 44 is mounted in the receiving slot 4195 of the mounting space 419. During this stage, the engaging end 445 of the pressing stage 44 is placed toward the upper surface of the working platform 411 and then aligned and inserted into the receiving slot 4195. The two inclined walls of the engaging end 445 respectively engage with the two inclined recesses 4713 of the two urging blocks 47.

When done, the two resisting members 45 and the two elastic members 46 are respectively mounted in the receiving cavities 4191 of the mounting space 419. At such time, the limiting portion 453 of each resisting member 45 is aligned towards the protruding block 4113 of the base 41. The engaging portion 455 of each resisting member 45 engages with the ledged end 4723 of each linking portion 472 of the respective urging block 47 via a sliding position. Each of the two elastic members 46 is mounted and elastically biased between the resisting portion 454 of the resisting member 45 and the interior wall of the mounting space 419. Each elastic member 46 has one end thereof resisting against the resisting portion 454 and the other end thereof resisting against the interior wall of the mounting space 419. Thus, the assembly of the apparatus 40 is completed.

Using the apparatus 40 to fix the FPC module 20 to the sliding mechanism 10 includes a plurality of steps as follows.

Figure 9:
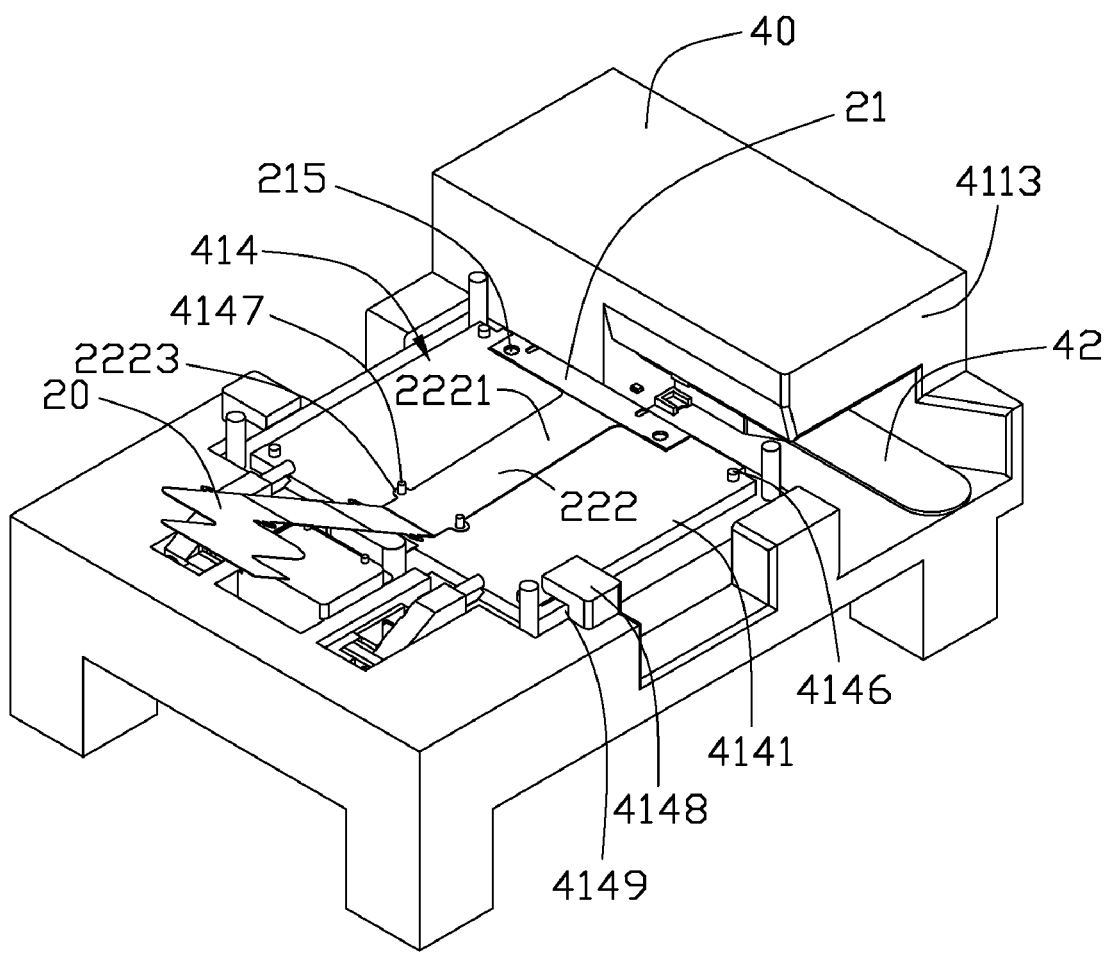
FIG. 9 is an isometric view of a first step for transforming the unassembled combination shown in FIG. 1 into the assembled combination shown in FIGS. 2 and 3 by using the apparatus shown in FIG. 4.

Referring to FIG. 4 and FIG. 9, the first step is to mount the FPC module 20 on the base stage 4141 of the assembling stage 414. The first connecting portion 21 of the FPC module 20 is accommodated and mounted in the slot 4142. As such, the first connector 212 is connected to the first mother connector 4144. The two second positioning columns 4145 each engage through the respective through holes 215 so as to secure the first connecting portion 21 within the slot 4142. The two fourth positioning columns 4147 are respectively coiled into the two first positioning holes 2223 of FPC body 22, which position the FPC body 22 to the base stage 4141.

Figure 10:
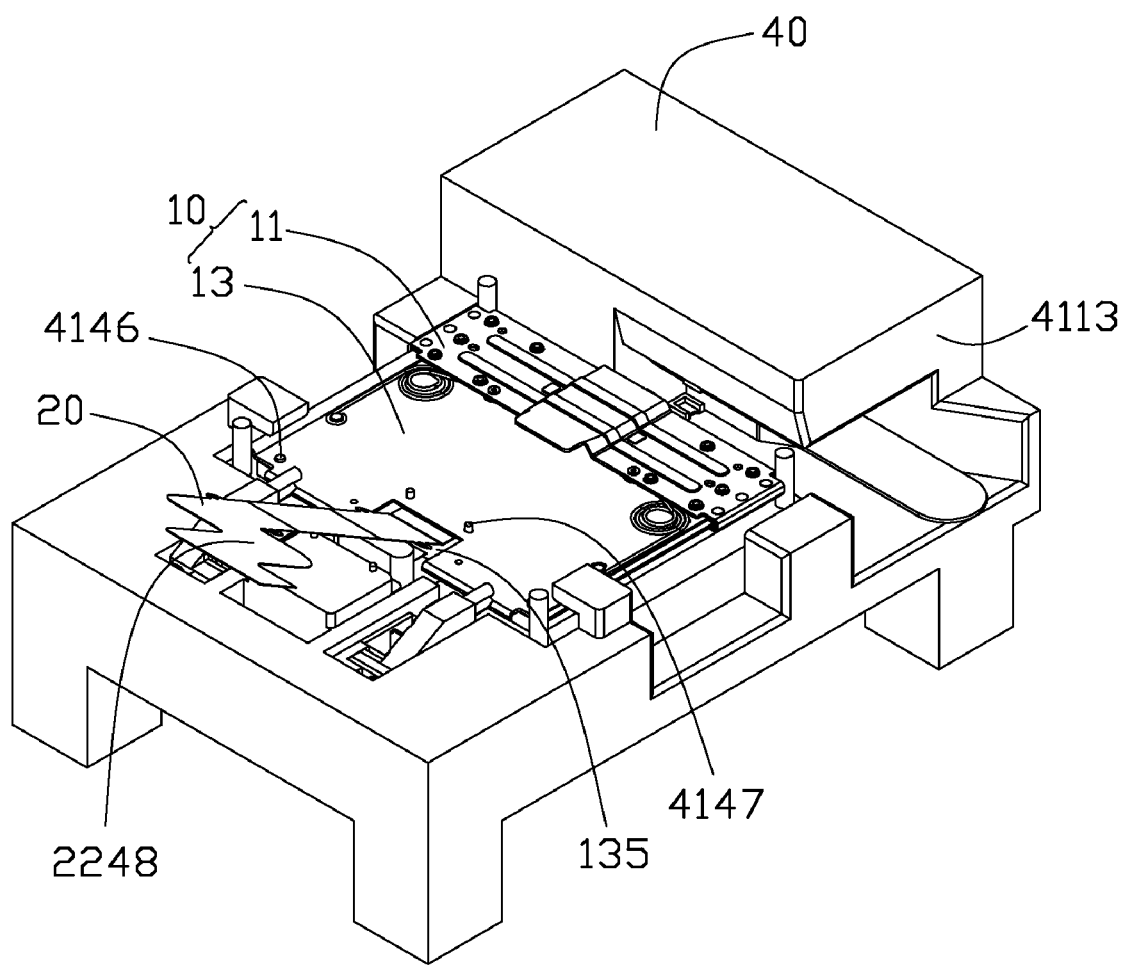
FIG. 10 is an isometric view of a second step following the first step shown in FIG. 9.

Referring also to FIGS. 5, 9 and 10, the second step is to mount the sliding mechanism 10 on the base stage 4141, where the slidable member 13 of the sliding mechanism 10 adheres to and covers the FPC module 20. At this stage, the four third positioning columns 4146 of the base stage 4141 engages through the four positioning holes 137 of the slidable member 13. The two fourth positioning columns 4147 are respectively coiled into the two aligning holes 138 of the slidable member 13. Thus, the sliding mechanism 10 is positioned to the base stage 4141. The sliding mechanism 10 is further pressed downwardly to adhere the slidable member 13 to the FPC module 20 by an adhering effect of the adhering layer of the attaching portion 2221 of the FPC module 20.

Referring also to FIG. 10 and referring further to FIG. 11, the third step details as follows. The adhering body 224 of the FPC body 22 is bent relative to the remainder of the FPC body 22 to pass through the cutout 135. The two fourth positioning columns 4147 are further respectively coiled into the second positioning holes 2226. Thus, the FPC body 22 is securely positioned to the base stage 4141 and the slidable member 13. The adhering body 224 is further pressed downwardly to adhere to the slidable member 13 by an adhering effect of the adhering layer of the adhering body 224.

Figure 11:
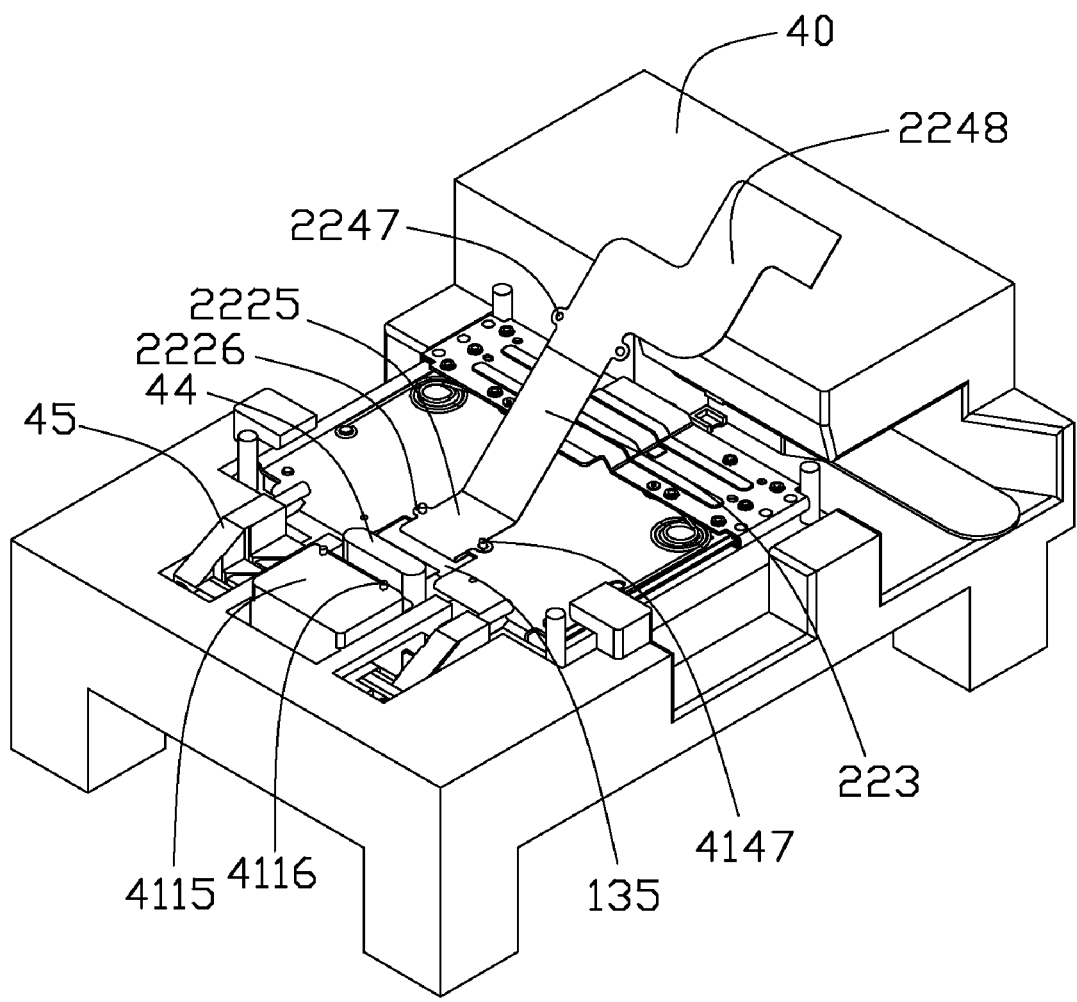
FIG. 11 is an isometric view of a third step following the second step shown in FIG. 10.
Figure 12:
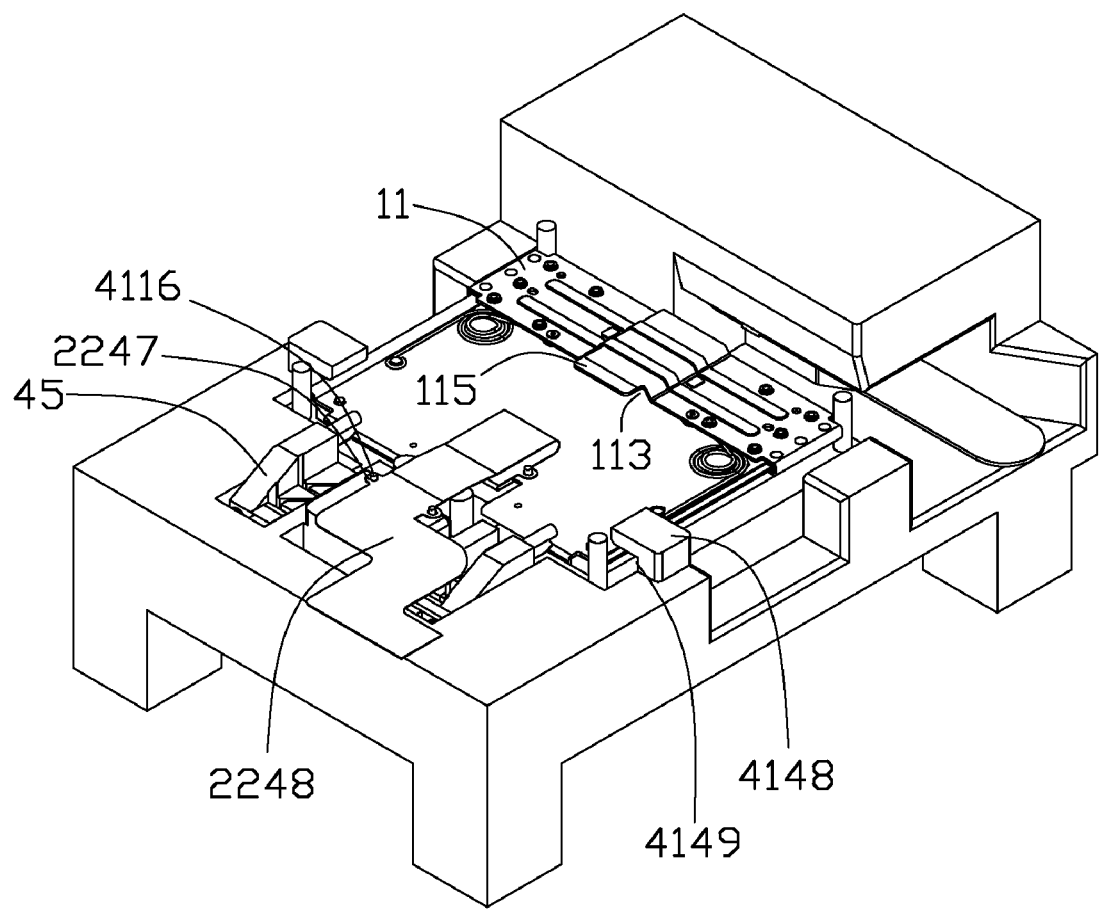
FIG. 12 is an isometric view of a fourth step following the third step shown in FIG. 11.

Referring to FIG. 11 and FIG. 12, the fourth step details as follows. The detaching body 223 of the FPC body 22 is bent in a direction adverse to that of the adhering body 224 and contacts the pressing stage 44 of the pressing device 43 and the positioning block 4115 of the base 41. The two positioning posts 4116 of the positioning block 4115 respectively engages through the two third positioning holes 2247 of the adhering body 224.

Figure 13:
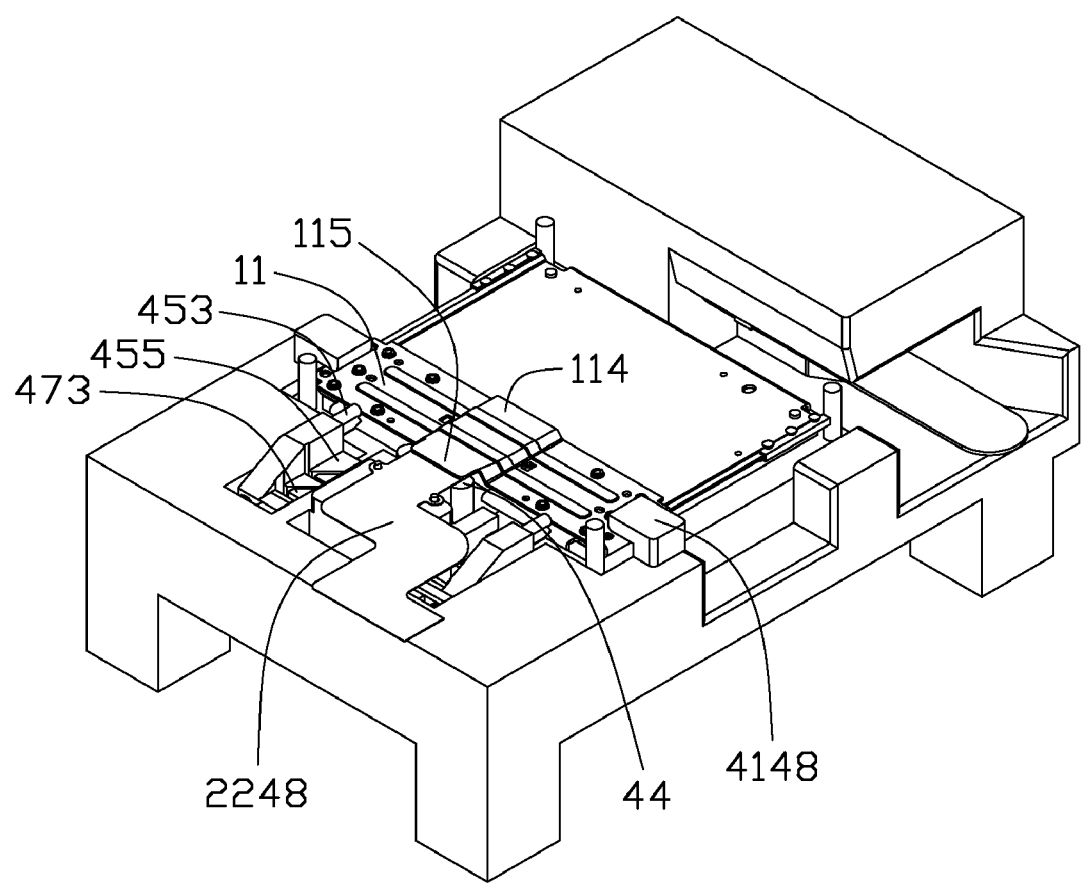
FIG. 13 is an isometric view of a fifth step following the fourth step shown in FIG. 12.

Referring to FIG. 12 and FIG. 13, the fifth step details as follows. The fixable member 11 of the sliding mechanism 10 slides along the slidable member 13 towards the pressing stage 44 until the fixable member 11 reaches and engages into the two resisting slots 4149 of the accommodating cavity 4114. Thus, the positioning portion 2225 of the attaching body 222, and part of the adhering end portion 2248 of the adhering body 224, are accommodated in the accommodating space 113 of the fixable member 11. The resisting flange 115 of the fixable member 11 slides at a position of which the resisting flange 115 is located right above the pressing stage

44. The fixable member 11 resists against the two limiting portions 453 of the two resisting members 45.

As the fixable member 11 is further urged toward the two resisting members 45, the elastic members 46 are respectively biased and the engaging portion 455 of each resisting member 45 simultaneously slidably engages with the ledged end 4723 of each linking portion 472 of the respective urging block 47. During this stage, the two urging blocks 47 move horizontally towards the positioning block 4115 and the distance between the two inclined recesses 4713 of the two urging blocks 47 is decreased. Correspondingly, the engaging end 445 moves vertically towards the resisting flange 115 by engaging the two inclined walls and the two inclined recesses 4713. Because the fixable member 11 is resisted from offsetting from the accommodating cavity 4114, the FPC body 22 is urged by the pressing stage 44 to adhere to the resisting flange 115 via the adhering layer of the adhering body 224.

Figure 14:
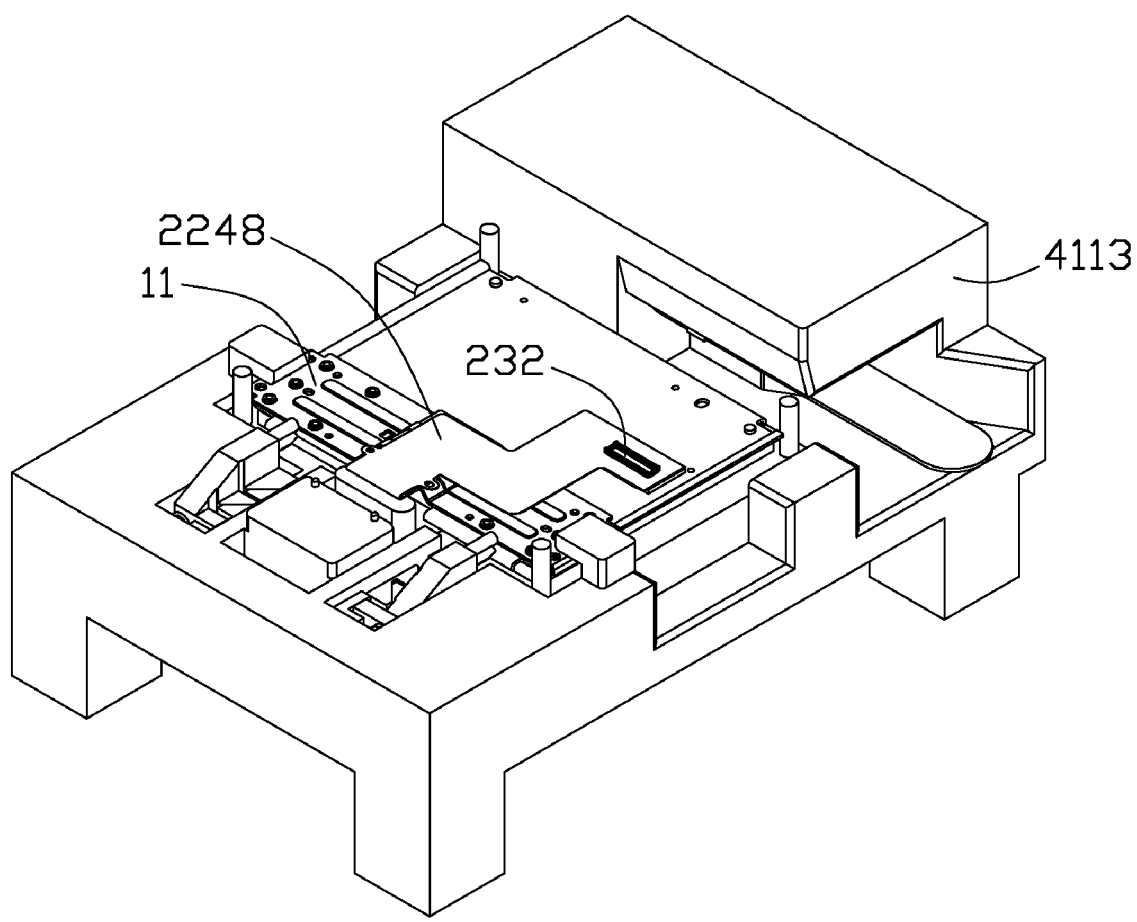
FIG. 14 an isometric view of a sixth step following the fifth step shown in FIG. 13.

Referring to FIG. 13 and FIG. 14, the sixth step details as follows. The remainder of the adhering body 224 is further bent around the resisting flange 115. The adhering end portion 2248 of the adhering body 224 is adhered to the protruding stage 114 of the fixable member 11 by the adhering layer formed thereon.

Figure 15:
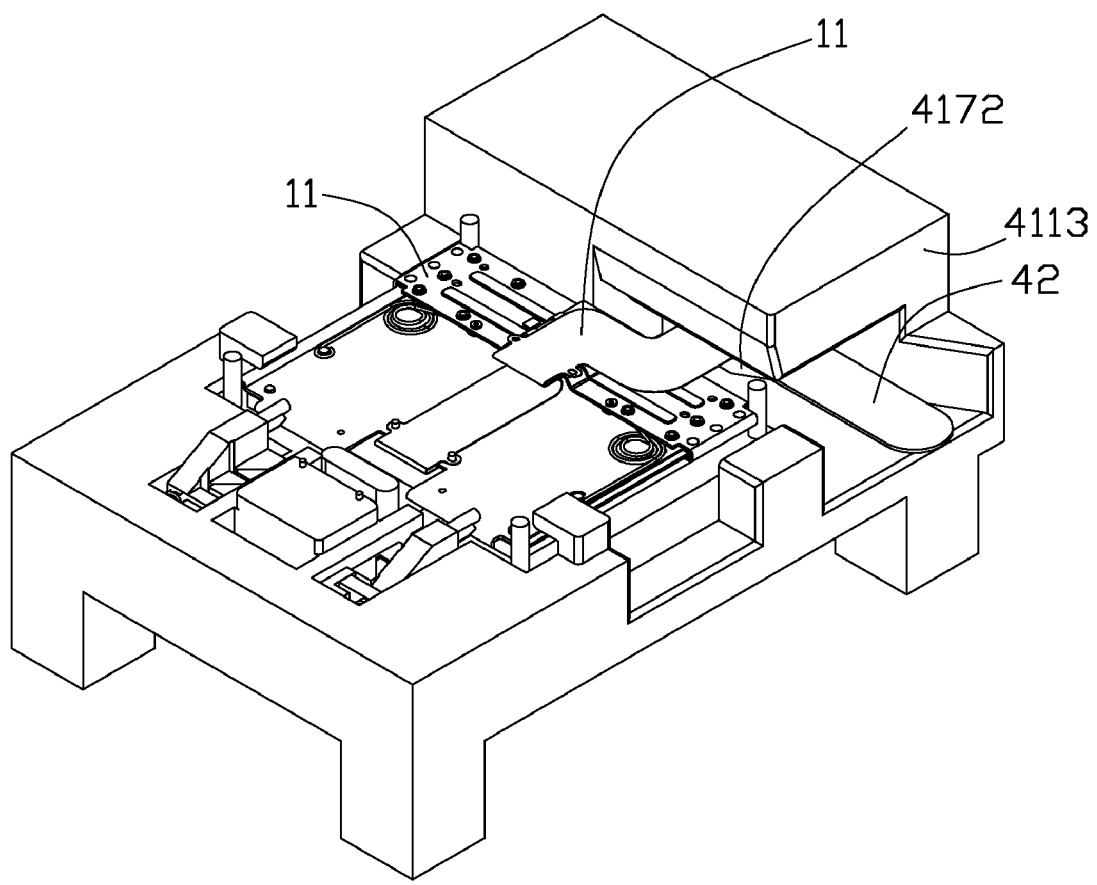
FIG. 15 is an isometric view of a seventh step following the sixth step shown in FIG. 14.

Referring to FIG. 14 and FIG. 15, the seventh step details as follows. The fixable member 11 is pushed and then slides toward the protruding block 4113 until the fixable member 11 firmly stops close to the protruding block 4113. Thus, the fixing of the FPC module 20 to the sliding mechanism 10 by using the apparatus 40 is completed. The sliding mechanism 10 in combination with the FPC module 20 can be easily detached from the base stage 4141 of the apparatus 40.

During the testing process of the FPC module 20, the second connector 232 of the connecting portions 23 of the FPC module 20 can extend into the accommodating chamber 417 and connect to the second mother connector 4175. As such, the FPC module 20 can be tested via electrically connecting the apparatus 40 to a testing apparatus. If the FPC module 20 passes the test, the second connector 232 can be detached from the second mother connector 4175 by downwardly pressing the detaching board 42.

Advantages of the present embodiment embody but are not limited to the following. The efficiency of fixing is highly increased by implementing the apparatus 40, which is achieved by using the base stage 4141 and the pressing device 43 to position and assemble the sliding mechanism 10 and the FPC module 20 in a fast manner. The whole performance is also enhanced by largely avoiding errors during the adhering process of the FPC module 20 adhering to the sliding mechanism 10. Moreover, tests for the FPC module 20 can be done by electrically connecting the apparatus 40 to the testing apparatus.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus for fixing a flexible printed circuit board module to a sliding mechanism of a portable electronic device, comprising:
a base including an assembling stage and defining a mounting space therein, the assembling stage being configured for positioning the sliding mechanism and the flexible printed circuit board module on the assembling stage;
a pressing device being mounted in the mounting space, the pressing device comprises a pressing stage, a resisting member, an elastic member, an urging block, and a base block, the base defines a receiving slot therein, the pressing stage engaging into the receiving slot and sliding relative to the receiving slot, the pressing stage comprising a pressing end and an engaging end, the urging block defining an inclined recess therein, the pressing stage, the resisting member, the elastic member, the urging block, and the base block mounted on the base, and the engaging end being engaged into the inclined recess, the pressing device sliding within the mounting space; and
wherein when the sliding mechanism is assembled to the flexible printed circuit board module by pressing of the pressing device, the resisting member moves to drive the urging block to move and bias the elastic member, the pressing end presses the flexible printed circuit board module toward the sliding mechanism.

2. The apparatus as claimed in claim 1, wherein the base defines an accommodating cavity therein, the assembling stage being accommodated in the accommodating cavity, the assembling stage including a base stage, a first positioning column, a second positioning column, a third positioning column, and a fourth positioning column, the base stage being configured for mounting the sliding mechanism thereon, and the positioning columns being configured for positioning the sliding mechanism and the flexible printed circuit board module thereto.

3. The apparatus as claimed in claim 2, wherein the assembling stage further comprises a resisting block, the resisting block and the lower surface of the accommodating cavity cooperatively define a resisting slot, and the resisting block being configured for resisting and accommodating a fixable member of the sliding mechanism in the resisting slot.

4. The apparatus as claimed in claim 3, wherein the base further comprises a positioning block, the positioning block having a positioning post formed on, and the positioning post being configured for positioning the flexible printed circuit board module thereto.

5. The apparatus as claimed in claim 4, wherein the mounting space is divided into a receiving cavity, a receiving recess, and a receiving slot, the resisting member, the urging block, and the pressing stage being respectively configured for engaging into and sliding relative to the receiving cavity, the receiving recess, and the receiving slot.

6. The apparatus as claimed in claim 5, wherein the resisting member comprises a body portion, a limiting portion, a resisting portion, and an engaging portion, the limiting portion, the resisting portion, and the engaging portion being respectively formed on the body portion, the limiting portion being configured for resisting the fixable member, the resisting portion being configured for resisting against the elastic member, the urging block comprising a linking portion, and the engaging portion corresponding to the linking portion.

7. The apparatus as claimed in claim 6, wherein the engaging portion has a plurality of ledged walls formed thereon, the linking portion having a ledged end formed therewith, and the ledged end being configured for engaging with the plurality of ledged walls.

8. The apparatus as claimed in claim 7, wherein the resisting member further comprises a resisting portion, the elastic member being mounted and elastically biased between the resisting portion and the interior wall of the mounting space.

9. The apparatus as claimed in claim 7, wherein the urging block further comprises a carrying portion, the carrying portion being generally L-shaped and including a first end portion and a second end portion, the first end portion and the second end portion being formed in perpendicular to each other, the inclined recess being defined in the first end portion, the linking portion being perpendicularly disposed on the second end portion.

10. The apparatus as claimed in claim 9, wherein the base block defines a mounting recess therein, the mounting recess being configured for mounting the urging block therein, and the base block being configured for fixing to the base.

11. The apparatus as claimed in claim 10, wherein the mounting recess is enclosed by a first sidewall, a second sidewall, a third sidewall, and a bottom wall, the first sidewall and the third sidewall respectively have two fixing holes defined therethrough, and the fixing holes being configured for facilitating the fixing of the base block and the base.

12. The apparatus as claimed in claim 4, wherein the base further comprises a protruding block and a detaching board, the accommodating cavity being disposed between the protruding block and the positioning block, the protruding block defining an accommodating chamber therein configured for accommodating the detaching board, and the accommodating chamber communicating with the accommodating cavity.

13. The apparatus as claimed in claim 12, wherein the interior wall of the accommodating chamber has a mother connector exposed to the accommodating chamber, the mother connector being configured for connecting to a connector of the flexible printed circuit board module.

14. The apparatus as claimed in claim 12, wherein the assembling stage has a slot defined therein, the slot being located in proximity to the protruding block and having a mother connector exposed to connect to a connector of the flexible printed circuit board module.

* * * * *